United States Patent [19]

Warner, Jr.

[11] 4,190,852
[45] Feb. 26, 1980

[54] PHOTOVOLTAIC SEMICONDUCTOR DEVICE AND METHOD OF MAKING SAME

[76] Inventor: Raymond M. Warner, Jr., 5001 Arden Ave., Minneapolis, Minn. 55424

[21] Appl. No.: 942,152

[22] Filed: Sep. 14, 1978

[51] Int. Cl.² ............................................. H01L 27/14
[52] U.S. Cl. ........................................ 357/30; 357/48; 357/86; 148/186; 148/189
[58] Field of Search ............................ 357/30, 48, 86; 148/186, 189

[56] References Cited

U.S. PATENT DOCUMENTS 3,994,012  11/1976  Warner ................................. 357/30

Primary Examiner—Martin H. Edlow
Attorney, Agent, or Firm—Peterson, Palmatier, Sturm & Sjoquist, Ltd.

[57] ABSTRACT

A photovoltaic semiconductor device which is a horizontal multijunction series-array solar battery with a monocrystalline body and having elongate zones of aluminum doped silicon passed entirely through N-type silicon layers by Thermomigration process to connect together epitaxially grown buried P layers. Masked elongate N diffusion zones which are parallel and substantially contiguous to each elongated P zone penetrates at least through the lowest P layer thereby forming an inactive pn junction. A thin shallow layer of P-type material is diffused across the top N-type layer. Topologically continuous photovoltaic junctions exist in each cell of the photovoltaic semiconductor device between the shallow layer of P-type material, the buried layer or layers of P-type material, the elongate zone of aluminum doped silicon, and the N-type silicon thereby forming active pn junctions. Metallic strips, at the other pn junctions formed by the thermomigrated aluminum which are inactive, electrically connect the cells together. A method is disclosed for manufacturing the photovoltaic semiconductor device.

22 Claims, 2 Drawing Figures

PHOTOVOLTAIC SEMICONDUCTOR DEVICE AND METHOD OF MAKING SAME

BACKGROUND OF THE INVENTION

1. Field of the Invention

The present invention relates generally to an active solid state semiconductor device, and more particularly, pertains to a photovoltaic semiconductor device which is horizontal multijunction series-array solar battery having a monocrystalline body.

2. Description of the Prior Art

In the field of photovoltaic semiconductor devices, also known as solar cells, it has been a general practice to solder individual cells together, also known as shingling the cells, to thereby form an array of cells.

Such solar cell arrays have been unsatisfactory in that the resultant array required a relatively large area for the interconnection of the cells in addition to being a very labor-intensive and expensive process, a process which has not lent itself to automation. Also, the solar cell arrays have been unreliable.

A photovoltaic cell is disclosed in FIG. 12 of U.S. Pat. No. 3,994,012, issued on Nov. 23, 1976 to the inventor of the present invention which is assigned to the assignee of the present invention.

The present invention overcomes the shortcomings of the prior art photovoltaic semiconductor devices by providing a horizontal multijunction series-array solar battery with a monocrystalline body having reduced parasitic series resistance and high collection efficiency.

SUMMARY OF THE INVENTION

The general purpose of this invention is to provide a photovoltaic semiconductor device which is a horizontal multijunction series-array solar battery with a monocrystalline body.

According to a preferred embodiment of the present invention, there is provided a photovoltaic semiconductor device having a relatively thick first horizontal layer of first conductivity material, a second horizontal layer of second conductivity material overlying the first layer of first conductivity material, a third horizontal layer of first conductivity material overlying the second layer of second conductivity material, plurality of first elongate zones of second conductivity material extending entirely through said third, second, and first layers, plurality of second elongate zones of heavily doped first conductivity material parallel and substantially contiguous to each of said first elongate zones of second conductivity material extending entirely through said third and second layers and at least slightly into the first layer, a fourth horizontal thin shallow layer of second conductivity material overlying the third horizontal layer of first conductivity material whereby topologically continuous active photovoltaic junctions are formed by the fourth and second horizontal layers and the first elongate zone of second conductivity material on the one, and the third and first horizontal layers and the second elongate zone of the first conductivity material on the other, metallization strips extending partially over a portion between said first and second elongate zones, said metallization strips serially connecting each cell to an adjacent cell of said photovoltaic semiconductor device by short circuiting inactive pn junctions which partially bound one side of each cell, said inactive pn junctions being formed by said first elongate zone of second conductivity material and by said second elongate zone of first conductivity material and said first horizontal layer.

One significant aspect and feature of the present invention is a thin shallow top horizontal layer of second conductivity material tied to a deeper laying horizontal layer of second conductivity material where the deeper lying horizontal layer of second conductivity material collects deeply generated carriers which would otherwise be lost. The thin shallow top horizontal layer provides efficient collection of the carriers at the topologically continuous active photovoltaic junction near the surface of the photovoltaic semiconductor device.

Another significant aspect and feature of the present invention is a horizontal multijunction series-array solar battery with a monocrystalline body having elongate zones of the emitter region extending through the thickness of the monocrystalline body where the cells are serially connected to each other by short circuiting inactive pn junctions which partially bound one side of each cell. Metallic strips of adjacent cells are applied on the surface of the semiconductor device at the inactive pn junctions by methods utilized in the art to connect the cells in the series-array.

Having briefly described one preferred embodiment of the present invention, it is a principal object hereof to provide a photovoltaic semiconductor device. The photovoltaic semiconductor device is a horizontal multijunction (HMJ) series-array solar battery with a monocrystalline body and having elongate zones of the emitter region passing entirely through thickness of the monocrystalline body. Battery is used in the context meaning a battery of cells or a plurality of cells and is not to be construed as a limiting term.

An object of the present invention is to provide a photovoltaic semiconductor device having low cost, high collection efficiency, and reduced parasitic series resistance. The parasitic resistance is very low for this horizontal multijunction series-array solar battery with a monocrystalline body resulting in low I²R losses in operation. Physically, the photovoltaic semiconductor device is rugged, self-supporting, and operates at "many suns". The present invention particularly lends itself to batch fabrication techniques.

Another object of the present invention is to provide a sophisticated photovoltaic semiconductor device which is particularly useful in a solar concentrator system. Besides solar concentrator systems, the photovoltaic semiconductor device can be used for low power applications such as watches, calculators, cameras, instruments, and surgically-implantable power sources.

BRIEF DESCRIPTION OF THE DRAWING

Other objects and many of the attendant advantages of this invention will be readily appreciated as the same becomes better understood by reference to the following detailed description when considered in connection with the accompanying drawing, in which like reference numerals designate like parts throughout the figures thereof and wherein.

DESCRIPTION OF THE PREFERRED EMBODIMENTS

Figure 1:
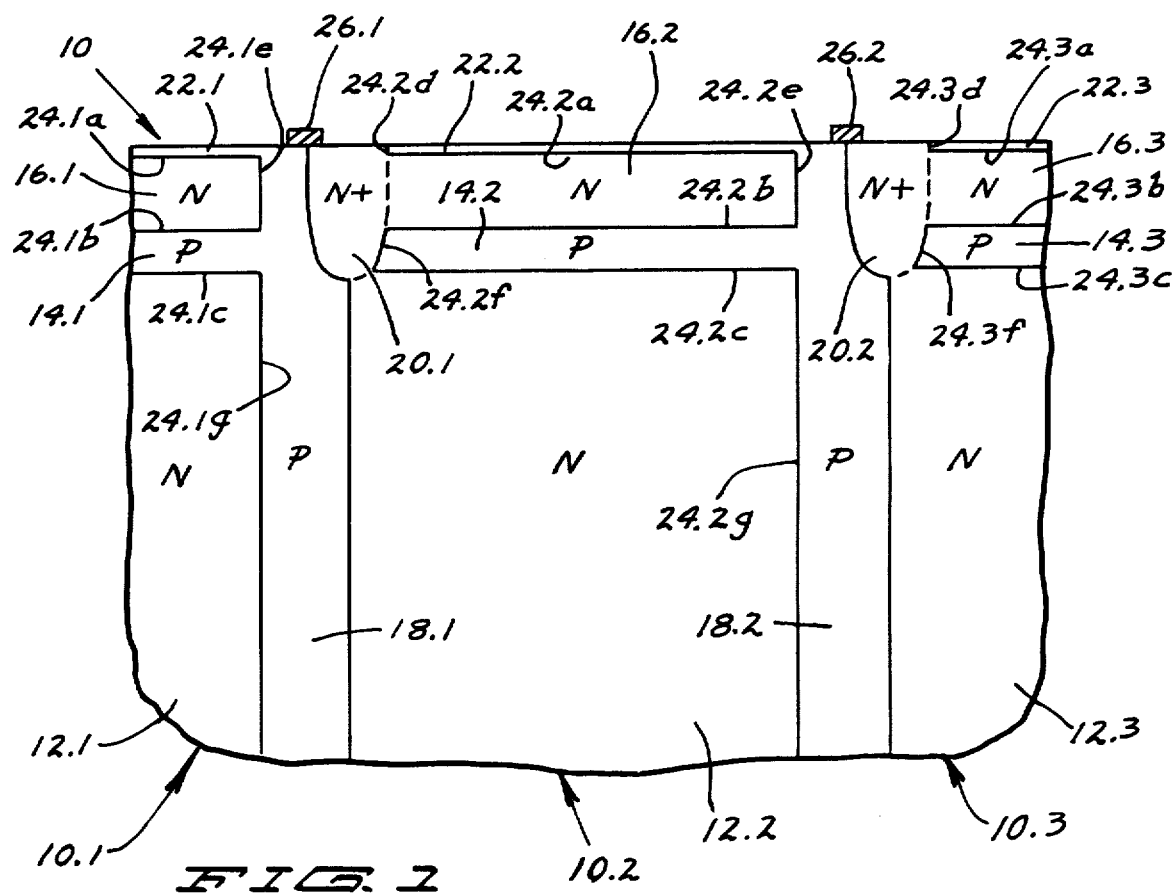
FIG. 1 illustrates a cross sectional view of the present invention, a photovoltaic semiconductor device.

FIG. 1, which illustrates a cross sectional view of the present invention, a photovoltaic semiconductor device 10, shows a first N-type silicon horizontal layer 12.1–12.3 having an initial concentration of either arsenic or antimony impurities introduced during crystal growth by way of example and for purposes of illustration only. The N layer 12 is a relatively thick self-supporting layer. A second horizontal layer 14.1–14.3 of P-type silicon material having a boron impurity by way of example and for purposes of illustration only is epitaxially grown on the first N-type silicon layer 12.1–12.3. A third horizontal layer 16.1–16.3 of N-type silicon material having a phosphorus impurity is epitaxially grown on the second P-type silicon layer 14.1–14.3. An elongate zone of aluminum, a P-type impurity, 18.1 and 18.2 is passed entirely through the thickness of the N-type layers 12 and 16 by the Thermomigration process, also known as Temperature Gradient Zone Melting, resulting in the vertical elongate zones 18.1 and 18.2 and thereby forming the discontinuities in the N layers 12 and 16. A masked vertical elongate N+ diffusion 20.1 and 20.2 paralleling each elongate zone of aluminum 18.1 and 18.2 penetrates at least slightly through the lowest P layer 14.1–14.3. A thin shallow top horizontal P layer 22.1, 22.2 and 22.3 having a boron impurity by way of example and for purposes of illustration only is solid phase diffused from the top surface of the device above the N layers 16.1, 16.2 and 16.3 respectively. The junction of the shallow P layer 22.1–22.3 and the buried N layer 16.1–16.3 forms a primary photovoltaic active pn junction 24.1a–24.3a. The junction of the P layer 14.1–14.3 and the N layers 16.1–16.3 and 12.1–12.3 forms auxiliary photovoltaic active pn junctions 24.1b–24.3b and 24.1c–24.3c respectively. Photovoltaic active pn junctions 24.2d, 24.2e, 24.2f and 24.2g are also formed as illustrated in the center of the figure but these three junctions account for negligible collection of carriers. The center photovoltaic cell 10.2 illustrates the topologically continuous photovoltaic junction 24.2a–24.2g. Aluminum is vapor deposited, subsequently patterned by photolithography and etching portions of the surface of the photovoltaic semiconductor device 10 thereby forming metallic strips 26.1 and 26.2 and forming a horizontal multijunction series-array solar battery with a monocrystalline body where each of the photovoltaic semiconductor cells 10.1, 10.2 and 10.3 of the photovoltaic semiconductor device 10 are serially connected by the metallic strips 26.1 and 26.2 at the other pn junctions between regions 18.1 and 20.1, and 18.2 and 20.2 respectively, which are inactive pn junctions.

The photovoltaic semiconductor device 10 can also have an anti-reflective layer overlying the fourth horizontal thin layer 22 to improve efficiency with which the light energy enters the silicon and is used as a matter of convention.

For a predetermined plurality of cells, batch fabrication techniques are utilized. The structure of FIG. 1 is repeated as illustrated for the photovoltaic semiconductor cells 10.1–10.3.

Figure 2:
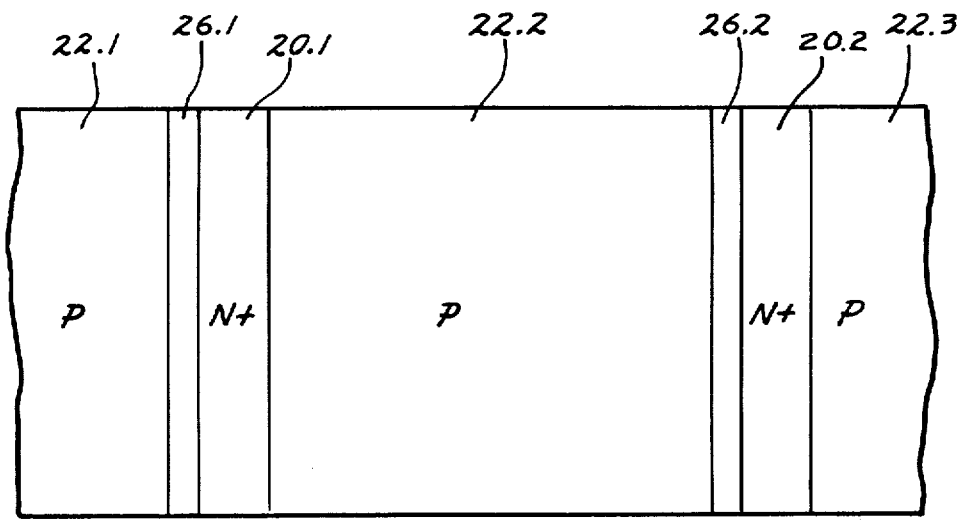
FIG. 2 illustrates a top plan view of the present invention.

FIG. 2 illustrates a top plan view of the present invention showing from left to right the thin shallow top horizontal P layer 22.1 of the photovoltaic semiconductor cell 10.1, the metallization strip 26.1, the second elongate zone of heavily doped N-type material 20.1, the thin shallow top horizontal P layer 22.2, the metallization layer 26.2 of the photovoltaic semiconductor cell 10.2, the second elongate zone of heavily doped N-type material 20.2 and the thin shallow top horizonal P layer 22.3 of the third photovoltaic cell 10.3.

PREFERRED MODE OF OPERATION

The photovoltaic semiconductor device 10 of the present invention is constructed utilizing microelectronic processes such as epitaxially growing the second horizontal layer overlying the first horizontal layer; epitaxially growing the third horizontal layer on the second horizontal layer; utilizing the Thermomigration process for carrying out Temperature Gradient Zone Melting (TGZM) of the plurality of first elongate zones; solid phase diffusing the plurality of second elongate zones; shallowly diffusing the fourth horizontal layer, and; subsequently vapor depositing, photolithographing and etching, and heat treating the metallization strips.

The Thermomigration process is particularly well adapted to passing the first deep elongate zones of material clear through the photovoltaic semiconductor device 10. The second elongate zones of material formed by solid-phase diffusion, a much slower process, just barely pass into the first thick horizontal layer. The first elongate zones of second conductivity material traverse the entire thickness of the silicon and are accomplished by utilizing the Thermomigration process which is very rapid process while the second zones of first conductivity material traverse a small fraction of the thickness of the silicon by solid-phase diffusion which is a relatively slow process which determines the depth of the second elongate zones. The speed asymmetry in these two processes matches the depth asymmetry in the desired structure.

The photovoltaic semiconductor device 10 is a self-supporting device. Coolants such as liquid can be circulated past the front, back or both sides of the device 10 for most efficient heat transfer.

Any plurality of photovoltaic semiconductor devices 10 can be serially connected together. The monolithic photovoltaic semiconductor devices 10 can have overall area as dictated by the state of the semiconductor crystal art.

The cells of the photovoltaic semiconductor device 10 are serially connected together at each of the inactive pn junctions of 18.1 and 20.1, and 18.2 and 20.2, between each of the cells. The metallization strips 26.1, 26.2, etc., interconnect the cells at the inactive pn junctions by short circuiting the inactive pn junctions and further provide the voltage take off points at the terminals of the device.

The junction formed by thin shallow top P layer 22.2 collects the majority of the carriers and the deeper lying P layer 14.2 connected by the elongate P zone 18.2 collects deeply generated carriers at its two major surfaces that would otherwise be lost when the photovoltaic semiconductor device is exposed to light.

While the plurality of first and second elongate zones have been disclosed as being parallel and substantially contiguous and illustrated as overlapping in the drawing, the first and second elongate zones can be adjacent and contacting a portion of the other zone or in the alternative, can be physically spaced from the other zone. While the preferred embodiment is where the first and second zones are parallel and substantially contiguous in overlapping as illustrated in the drawing, embodiments of the zones being adjacent to the other zone or the zones being spaced yields the result where the topologically continuous active photovoltaic junction area decreases.

While the specification has disclosed a second horizontal P layer 14 and a third horizontal N layer 16, additional alternating layers of P and N material can be utilized between the relatively thick horizontal N layer 12 and the thin horizontal P layer 22. By way of example and for purposes of illustration only, an additional one, two, three, etc. pairs of alternating P and N layers can be utilized as desired.

An alternative photovoltaic semiconductor device can utilize the relatively thick horizontal self-supporting N-type layer 12 and the thin horizontal P-type layer 22.

Various modifications can be made to the photovoltaic semiconductor device of the present invention without departing from the apparent scope thereof. Other microelectronic processes can be utilized besides the Thermomigration process. Materials other than silicon can be utilized such as the family of III-V compounds including gallium arsenide. Impurities in the first N-type silicon layer can be any suitable impurity from Class V group including arsenic and antimony.

Having thus described the invention, what is claimed is:

1. A photovoltaic semiconductor device having a plurality of photovoltaic semiconductor cells comprising:
   a. relatively thick first horizontal layer of first conductivity material;
   b. second horizontal layer of second conductivity material overlying said first horizontal layer of said first conductivity material;
   c. third horizontal layer of first conductivity material overlying said second horizontal layer of said second conductivity material;
   d. plurality of first elongate zones of second conductivity material extending entirely through said third, second, and first horizontal layers;
   e. plurality of second elongate zones of heavily doped first conductivity material parallel and substantially contiguous to each of said first elongate zones of second conductivity material extending entirely through said third and second layers and at least slightly into said first layer;
   f. fourth horizontal thin shallow layer of said second conductivity material overlying said third horizontal layer of said first conductivity material, and;
   g. metallization strips extending over a portion between each of said first and second elongate zones whereby topologically continuous active photovoltaic junctions are formed by said fourth and second horizontal layers and said first elongate zone of second conductivity material on the one, and said third and first horizontal layers and said second elongate zone of said first conductivity material on the other, with metallization strips extending over a portion between said first and second elongate zones, said metallization strips serially connecting each cell to an adjacent cell of said photovoltaic semiconductor device by short circuiting inactive pn junctions which bound one side of each cell, said inactive pn junctions being formed by said first elongate zone of second conductivity material on the one and by said second elongate zone of first conductivity material and said first horizontal layer on the other.

2. The device of claim 1 wherein said first conductivity material of said first horizontal layer is N-type material.

3. The device of claim 2 wherein said N-type material has an antimony impurity.

4. The device of claim 2 wherein said N-type material has an arsenic impurity.

5. The device of claim 1 wherein said second conductivity material of said second horizontal layer is P-type material.

6. The device of claim 5 wherein said P-type material has a boron impurity.

7. The device of claim 1 wherein said first conductivity material of said third horizontal layer is N-type material.

8. The device of claim 7 wherein said N-type material has a phosphorus impurity.

9. The device of claim 1 wherein said second conductivity material of said first elongate zone is P-type material.

10. The device of claim 9 wherein said P-type material has an aluminum impurity.

11. The device of claim 1 wherein said first conductivity material of said second elongate zone is N-type material.

12. The device of claim 11 wherein said N-type material is doped with a phosphorus impurity.

13. The device of claim 1 wherein said second conductivity material of said fourth horizontal layer is P-type material.

14. The device of claim 13 wherein said P-type material has a boron impurity.

15. The device of claim 1 comprising an additional pair of horizontal P and N layers between said third and fourth horizontal layers.

16. The device of claim 1 comprising an additional two pairs of horizontal P and N layers between said third and fourth horizontal layers.

17. The device of claim 1 wherein said first elongate zone and said second elongate zone are overlapping.

18. The device of claim 1 wherein said first elongate zone and said second elongate zone are adjacent to and contacting a portion of each other.

19. The device of claim 1 wherein said first elongate zone and said second elongate zone are spaced from each other.

20. A horizontal multijunction series-array solar battery with a monocrystalline body and having an extension of an emitter region passing through entire thickness of said body comprising:
   a. relatively thick first horizontal layer of N-type material having a class V impurity;
   b. second horizontal layer of P-type material having a boron impurity overlying said first layer of said first conductive material;
   c. third horizontal layer of N-type material having a phosphorus impurity overlying said second layer of said second conductivity material;
   d. first elongate zones having an aluminum impurity extending entirely through said third, second, and first layers;
   e. second elongate zone of heavily doped N-type material having a phosphorus impurity parallel and substantially contiguous to each of said first elongate zones of second conductivity material extending entirely through said third and second layers and slightly into said first layer;

f. fourth horizontal thin shallow layer of P-type material having a boron impurity overlying said third horizontal layer of said N-type material, and;

g. aluminum metallization strips extending over a portion between each of said first and second elongate zones whereby topologically continuous active photovoltaic junctions are formed by said fourth and second horizontal layers and said first elongate zone of second conductivity material on the one, and said third and first horizontal layers and said second elongate zone of said first conductivity on the other, with metallization strips extending over a portion between said first and second elongate zones, said metallization strips serially connecting each cell to an adjacent cell of said photovoltaic semiconductor device by short circuiting inactive pn junctions which bound one side of each cell, said inactive pn junctions being formed by said first elongate zone of second conductivity material on the one and by said second elongate zone of first conductivity material and said first horizontal layer on the other.

21. A method of manufacturing a photovoltaic semiconductor device comprising the steps of:

a. epitaxially growing a second horizontal layer of second conductivity material overlying a first horizontal layer of first conductivity material;

b. epitaxially growing a third horizontal layer of first conductivity material on said second horizontal layer of second conductivity material;

c. producing a plurality of first elongate zones of second conductivity material extending entirely through said third, second and first horizontal layers;

d. solid-phase diffusing a plurality of second elongate zones of heavily doped first conductivity material parallel and substantially contiguous to each of said first elongate zones of second conductivity material extending entirely through said third and second layers and at least slightly into said first layer;

e. shallowly diffusing a fourth horizontal thin shallow layer of second conductivity material overlying said third horizontal layer of second conductivity material, and;

f. vapor depositing, photolithographing and etching, and heat treating metallization strips extending over a portion between said first and second elongate zones whereby topologically continuous active photovoltaic junctions are formed by said fourth and second horizontal layers and said first elongate zone of second conductivity material on the one, and said third and first horizontal layers and said second elongate zone of said first conductivity material on the other, each of said first elongate zones of second conductivity material and said second elongate zones of first conductivity material form inactive pn junctions which partially bound one side of each of the photovoltaic semiconductor cells, said metallization strips serially connect each cell to an adjacent cell of said photovoltaic semiconductor device, and the speed asymmetry in said producing process and said solid-phase diffusion process matches the depth asymmetry of said first and said second elongate zones.

22. A photovoltaic semiconductor device having a plurality of photovoltaic semiconductor cells comprising:

a. relatively thick first horizontal self-supporting layer of first conductivity material;

b. plurality of first elongate zones of a second conductivity material extending entirely through said first horizontal layers;

c. plurality of second elongate zones of heavily doped first conductivity material parallel and substantially contiguous to each of said first elongate zones of second conductivity material extending at least slightly into said first layer;

d. second horizontal thin shallow layer of said second conductivity material overlying said first horizontal layer of said first conductivity material, and;

e. metallization strips extending over a portion between each of said first and second elongate zones whereby topologically continuous active photovoltaic junctions are formed by said fourth and second horizontal layers and said first elongate zone of second conductivity material on the one, and by said third and first horizontal layers and said second elongate zone of said first conductivity material on the other, with metallization strips extending over a portion between said first and second elongate zones, said metallization strips serially connecting each cell to an adjacent cell of said photovoltaic semiconductor device by short circuiting inactive pn junctions which bound one side of each cell, said inactive pn junctions being formed by said first elongate zone of second conductivity material on the one and by said second elongate zone of first conductivity material and said first horizontal layer on the other.

* * * * *